United States Patent
He et al.

(10) Patent No.: US 10,282,498 B2
(45) Date of Patent: May 7, 2019

(54) PROCESSOR-IMPLEMENTED SYSTEMS AND METHODS FOR TIME DOMAIN DECOMPOSITION TRANSIENT SIMULATION IN PARALLEL

(71) Applicant: Ansys, Inc., Canonsburg, PA (US)

(72) Inventors: Bo He, Wexford, PA (US); Dingsheng Lin, Venetia, PA (US); Chuan Lu, Bridgeville, PA (US); Ping Zhou, Bethel Park, PA (US); Ningning Chen, Bridgeville, PA (US)

(73) Assignee: Ansys, Inc., Canonsburg, PA (US)

( * ) Notice: Subject to any disclaimer, the term of this patent is extended or adjusted under 35 U.S.C. 154(b) by 295 days.

(21) Appl. No.: 15/244,258

(22) Filed: Aug. 23, 2016

(65) Prior Publication Data

US 2017/0061047 A1    Mar. 2, 2017

Related U.S. Application Data

(60) Provisional application No. 62/209,155, filed on Aug. 24, 2015.

(51) Int. Cl.
*G06F 17/50* (2006.01)
*G06F 17/13* (2006.01)
*G06F 19/00* (2018.01)

(52) U.S. Cl.
CPC .......... *G06F 17/5009* (2013.01); *G06F 17/13* (2013.01); *G06F 19/00* (2013.01)

(58) Field of Classification Search
CPC ....... G06F 17/5009; G06F 17/13; G06F 19/00
(Continued)

(56) References Cited

U.S. PATENT DOCUMENTS

| 8,543,360 B2 * | 9/2013 | Nakhla | G06F 17/5036 703/2 |
| 2007/0157135 A1 * | 7/2007 | Yang | G06F 17/5036 716/111 |

(Continued)

OTHER PUBLICATIONS

Jalili-Marandi, Vahid, Zhiyin Zhou, and Venkata Dinavahi. "Large-scale transient stability simulation of electrical power systems on parallel GPUs.";Power and Energy Society General Meeting, 2012 IEEE. IEEE, 2012. pp. 1-11. (Year: 2012).*

(Continued)

*Primary Examiner* — Aniss Chad
*Assistant Examiner* — John E Johansen
(74) *Attorney, Agent, or Firm* — Jones Day (57) ABSTRACT

Systems and methods are provided for constructing a physical system. Characteristic data associated with a physical system is received. A model of the physical system is built based on the characteristic data. A nonlinear transient simulation of the physical system is performed using the model, where the simulation is performed over a plurality of time intervals. The simulation includes segmenting the plurality of time intervals into groups of time intervals, each group containing multiple time intervals, transmitting data associated with each group of time intervals to a different solving unit, and solving each of the groups of time intervals in parallel using the different solving units. A physical characteristic is determined based on results of the simulation, where the physical system is built or modified based on the simulation-determined physical characteristic.

22 Claims, 11 Drawing Sheets

(58) Field of Classification Search
USPC .............................................................. 703/2
See application file for complete search history.

(56) References Cited

U.S. PATENT DOCUMENTS

2010/0106949 A1* 4/2010 Komatsu ................... G06F 8/45
712/226
2010/0299509 A1* 11/2010 Doi ......................... G06F 9/325
712/241

OTHER PUBLICATIONS

Zecevic, A. I., and D. D. Siljak. "A Block-Parallel Newton Method via Overlapping Epsilon Decompositions." American Control Conference, 1992. IEEE, 1992. pp. 1653-1659. (Year: 1992).*
Amano, M. Z. A. I., A. I. Zecevic, and D. D. Siljak. "An improved block-parallel Newton method via epsilon decompositions for load-flow calculations." IEEE transactions on power systems 11.3 (1996). pp. 1519-1527. (Year: 1996).*

* cited by examiner

PROCESSOR-IMPLEMENTED SYSTEMS AND METHODS FOR TIME DOMAIN DECOMPOSITION TRANSIENT SIMULATION IN PARALLEL

CROSS-REFERENCE TO RELATED APPLICATIONS

This application claims priority to U.S. Provisional Application No. 62/209,155, filed Aug. 24, 2015, the entirety of which is herein incorporated by reference.

BACKGROUND

Computer simulation, which uses mathematical models to replicate the behavior of physical systems, has become indispensable in broad areas of engineering analysis and design. One of key parts of computer simulation is to solve the physical equations (e.g., equations derived from characteristic data associated with physical characteristics of a physical system) numerically. These physical equations (often called the dynamical equations) are generally composed of both spatial derivative and time derivative terms, describing the physical quantities varying in space and time. There are two typical methods to numerically analyze those dynamical equations, namely, in the frequency domain and in the time domain. In the frequency domain, the physical quantities can be expressed in terms of frequency by Fourier transformation, rather than in terms of time. Usually, the frequency domain simulation is a very efficient method for the linear physical systems, but is either not economical or lacks accuracy for the nonlinear physical systems. Therefore, the time domain simulation (also called transient simulations) is often adopted for the nonlinear physical systems.

SUMMARY

Systems and methods are provided for constructing a physical system. Characteristic data associated with a physical system is received. A model of the physical system is built based on the characteristic data. A nonlinear transient simulation of the physical system is performed using the model, where the simulation is performed over a plurality of time intervals. The simulation includes segmenting the plurality of time intervals into groups of time intervals, each group containing multiple time intervals, transmitting data associated with each group of time intervals to a different solving unit, and solving each of the groups of time intervals in parallel using the different solving units. A physical characteristic is determined based on results of the simulation, where the physical system is built or modified based on the simulation-determined physical characteristic.

As another example, a computer-implemented system for constructing a physical system includes one or more data processors and a computer-readable medium encoded with instructions for commanding one or more data processors to execute steps of a method. In the method, characteristic data associated with a physical system is received. A model of the physical system is built based on the characteristic data. A nonlinear transient simulation of the physical system is performed using the model, where the simulation is performed over a plurality of time intervals. The simulation includes segmenting the plurality of time intervals into groups of time intervals, each group containing multiple time intervals, transmitting data associated with each group of time intervals to a different solving unit, and solving each of the groups of time intervals in parallel using the different solving units. A physical characteristic is determined based on results of the simulation, where the physical system is built or modified based on the simulation-determined physical characteristic.

As a further example, a computer-readable medium is encoded with instructions for commanding one or more data processors to execute steps of a method for constructing a physical system. In the method, characteristic data associated with a physical system is received. A model of the physical system is built based on the characteristic data. A nonlinear transient simulation of the physical system is performed using the model, where the simulation is performed over a plurality of time intervals. The simulation includes segmenting the plurality of time intervals into groups of time intervals, each group containing multiple time intervals, transmitting data associated with each group of time intervals to a different solving unit, and solving each of the groups of time intervals in parallel using the different solving units. A physical characteristic is determined based on results of the simulation, where the physical system is built or modified based on the simulation-determined physical characteristic.

DETAILED DESCRIPTION

A transient simulation, in one embodiment, includes the spatial discretization and temporal discretization of the physical equations. There are several approaches to do the spatial discretization (e.g., finite differences, finite elements, and finite volumes). The finite element method (FEM) is widely used in engineering practice because, using irregular grids, it can model complex inhomogeneous and anisotropic materials and represent complicated geometry. The FEM discretization produces a set of matrix differential equations. A temporal discretization can include backward Euler, Crank-Nicolson, and theta-methods. Because of the nonlinearity, the matrices generally are dependent of the solution vectors, so an iteration method such as Newton-Raphson method can be used to solve these nonlinear matrix equations. Namely, the nonlinear matrix equations are linearized for each nonlinear iteration. The linearized matrix equations may be solved by either a direct or iterative matrix solver. The transient simulation usually is time-consuming since it requires $N_t N_e$ number of matrix solving, where $N_t$ is the number of time steps and $N_e$ is the average number of nonlinear iterations.

Provided that an algorithm (or method) can be made parallel, parallel computing can cut down the simulation time for the transient problems. For example, parallel computing can be applied to the matrix solving at each time step. This can improve performance, but it is not always possible to make full use of all the parallel cores because the scaling is limited by various factors, such as communication between the cores. In order to achieve better parallel scalability, systems and methods can utilize domain decomposition along time-axis (TDM) to solve all time steps (or a subdivision of all time steps) simultaneously, instead of solving a transient problem time step by time step. For practical applications, systems and methods can utilize two TDM models: one is the Periodic TDM Model for periodic steady-state simulation based on solving all time steps simultaneously; the other is the General TDM Model for general transient applications based on solving a subdivision of all time steps simultaneously. The discretization of both TDM models results in the form of block matrices. The structure of the block matrices is, in some examples, able to fully take advantages of parallel computing with the help of certain algorithms. This can achieve high parallel computing efficiency by proposing both dedicated direct solvers and preconditioned iterative solvers for solving these block matrices.

Figure 1:
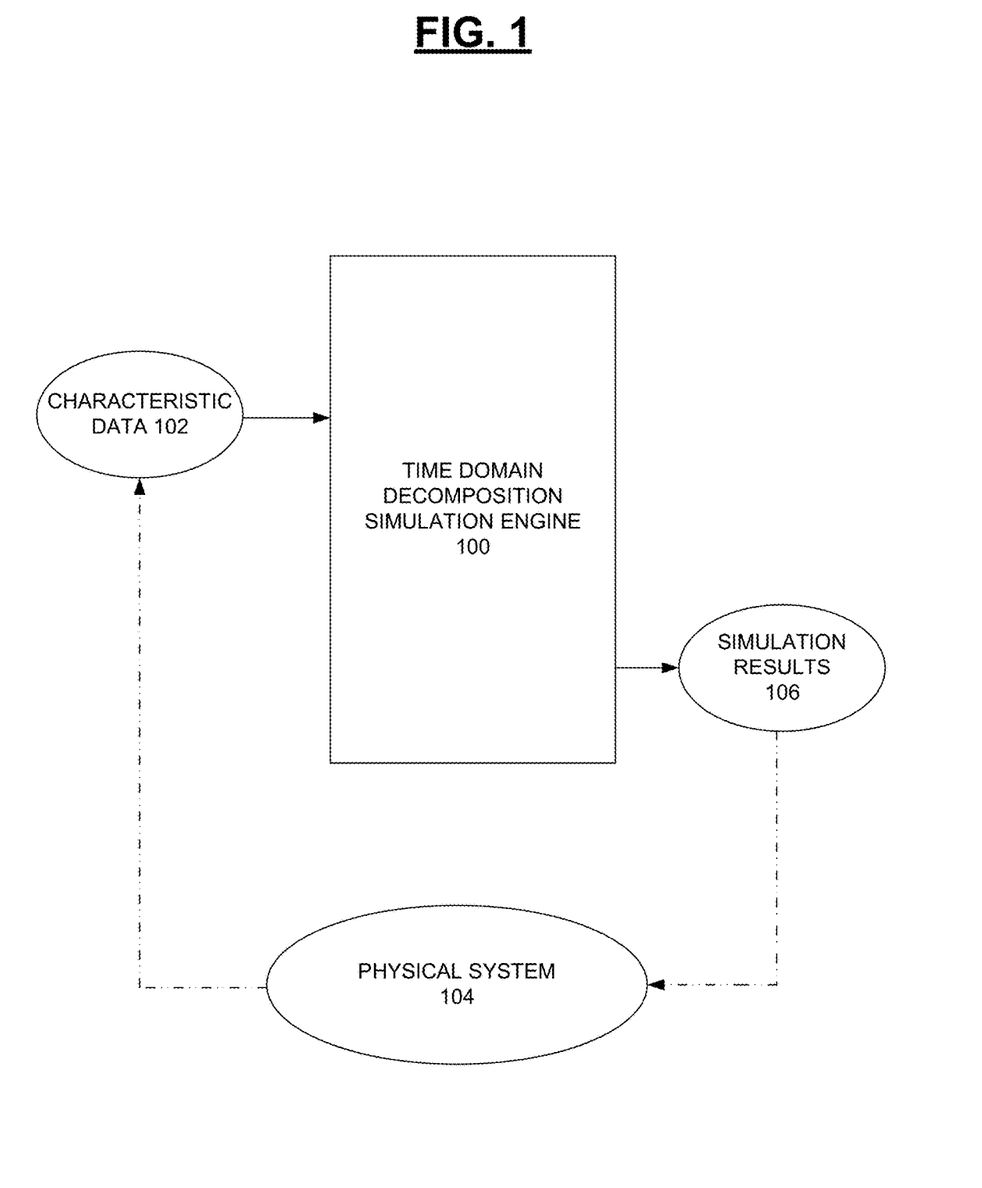
FIG. 1 is a diagram depicting a time domain decomposition simulation engine.

FIG. 1 is a diagram depicting a time domain decomposition method (TDM) simulation engine. A simulation engine 100 receives characteristic data 102 associated with a physical system 104. The simulation engine 100 builds a model of the physical system based on the characteristic data. The simulation engine 100 performs a nonlinear transient simulation of the physical system using the model, where the simulation is performed over a plurality of time intervals. The simulation includes segmenting the plurality of time intervals into groups of time intervals, each group containing multiple time intervals. Data associated with each group of time intervals is transmitted to a different solving unit, where each of the groups of time intervals is solved in parallel using the different solving unit. A physical characteristic is outputted from the engine 100 as simulation results, where the physical system is built or modified based on the simulation-determined physical characteristic.

Figure 2:
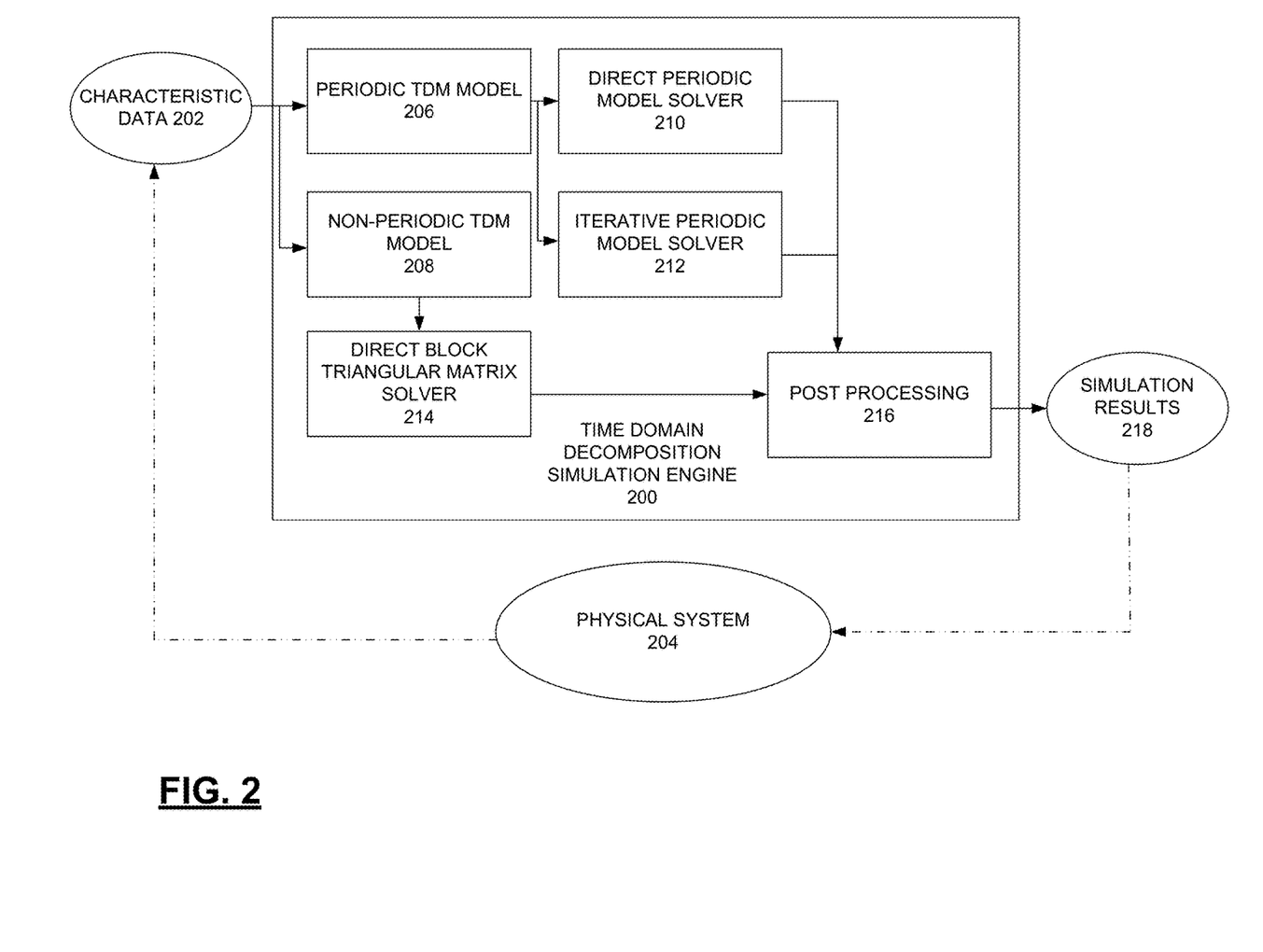
FIG. 2 is a diagram depicting example operations of a time domain decomposition engine.

FIG. 2 is a diagram depicting example operations of a time domain decomposition engine. The engine 200 receives characteristic data 202 associated with a physical system 204. Based on the type associated with the physical system 204 or on a type of excitation imparted onto the physical system 204 (e.g., based on a detection by the engine 200 or a manual selection), a particular type of time domain decomposition model is selected. For example, where a system 204 or excitation is likely to result in periodic behavior, a periodic TDM model 206 is selected, while a non-periodic system/excitation will utilize a non-periodic model 208 (e.g., where physical system 204 is subjected to a periodic excitation and the system response is expected to have the same period, a periodic TDM model 206 is selected). When a periodic TDM model 206 is used, either a direct periodic model solver 210 or an iterative periodic model solver 212 is used to solve each of the groups of time intervals. When a non-periodic TDM model 208 is used, a direct block triangular matrix solver 214 can be utilized for solving. The results from one of the solvers 210, 212, 214, are forwarded to a post processing module 216 that interprets the simulation results to determine a physical characteristic of the physical system 204, which is outputted at 218 for use in building or modifying the physical system 204.

Transient simulations have a range of engineering applications which include wave propagation in a complex medium, heat conduction, transient behavior of electromechanical devices, and so on. The spatial discretization of dynamical equations produces a semi-discrete form as $$S(x,t)x(t) + \frac{d}{dt}[T(x,t)x(t)] = f(x,t) + \frac{d}{dt}[w(x,t)] \quad (1)$$

In the above, S(x,t) and T(x,t) are matrices, f(x,t) and w(x,t) are excitation vectors, and x(t) is solution vector representing some physical quantity, such as the magnetic field, elastic displacement, etc. Note that S(x,t) and T(x,t) are dependent on x(t) to reflect the non-linearity of the system. Depending on the physical system, not all of the above matrix or excitation vectors are dependent on x(t). For example, in one example, only matrix S(x,t) depends on x(t) in transient finite-element analysis of electric machines based on the A-phi formulation. The traditional method to solve the equation is time-consuming since it requires $N_t N_e$ number of matrix solving, where $N_t$ is the number of time steps and $N_e$ is the average number of nonlinear iterations. In order to take full advantage of high performance computing capabilities, certain systems and methods as described herein introduce two types of TDM models: one is the Periodic TDM Model for transient periodic steady-state simulation; the other is the General TDM Model for general transient applications.

Periodic TDM Model

The periodic model is used to simulate the steady state behavior of a system with a time periodic input. For this model, the initial condition may not be required and in fact may not be known a priori, and the solution and excitation vectors satisfy the periodic condition. That is, $$x(t)=x(t+T), f(t)=f(t+T), w(t)=w(t+T) \quad (2)$$

holds with T the period of the system. The semi-discrete form (1) can be further discretized by applying the backward Euler method, $$S_i x_i + \frac{T_i x_i - T_{i-1} x_{i-1}}{\Delta t} = f_i + \frac{w_i - w_{i-1}}{\Delta t} \quad (3)$$

Here the subscript i denotes the value of a quantity at time point $t_i$, e.g. $x_i = x(t_i)$.

For simplicity and easy explanation, only the backward Euler method is used for the temporal discretization in this description. But, this is not a limitation to the systems and methods described herein. Namely, the systems and methods described herein can be applied equally to other temporal discretization methods such as Crank-Nicolson, and the theta-method. Higher-order integration methods (such as BDF2) that involve more than one previous time point can be used as well. Using and applying the Newton-Raphson method, results in the following linearized matrix equations.

$$\begin{bmatrix} K_1 & 0 & \ldots & 0 & M_n \\ M_1 & K_2 & \ldots & 0 & 0 \\ 0 & M_2 & \ddots & \vdots & \vdots \\ \vdots & \vdots & \ddots & K_{n-1} & 0 \\ 0 & 0 & \ldots & M_{n-1} & K_n \end{bmatrix} \begin{bmatrix} \Delta x_1 \\ \Delta x_2 \\ \vdots \\ \Delta x_{n-1} \\ \Delta x_n \end{bmatrix} = \begin{bmatrix} b_1 \\ b_2 \\ \vdots \\ b_{n-1} \\ b_n \end{bmatrix} \quad (4)$$

where, $K_i = \Delta t S'_i + T'_i$ and $M_i = -T'_i$ are the Jacobian matrices, $\Delta x_i$ is the increment of nonlinear iterations, and $b_i$ is the residual of nonlinear iterations.

Let $$A = \begin{bmatrix} K_1 & 0 & \ldots & 0 & M_n \\ M_1 & K_2 & \ldots & 0 & 0 \\ 0 & M_2 & \ddots & \vdots & \vdots \\ \vdots & \vdots & \ddots & K_{n-1} & 0 \\ 0 & 0 & \ldots & M_{n-1} & K_n \end{bmatrix} \quad (5)$$

Then equation (4) can be written in concise form as $$A\Delta x = b \quad (6)$$

Because of the block form of (4), it can be efficiently solved with proper parallel computing algorithm with either a direct solver or an iterative solver which will be further herein.

General Transient TDM Model

Figure 3:
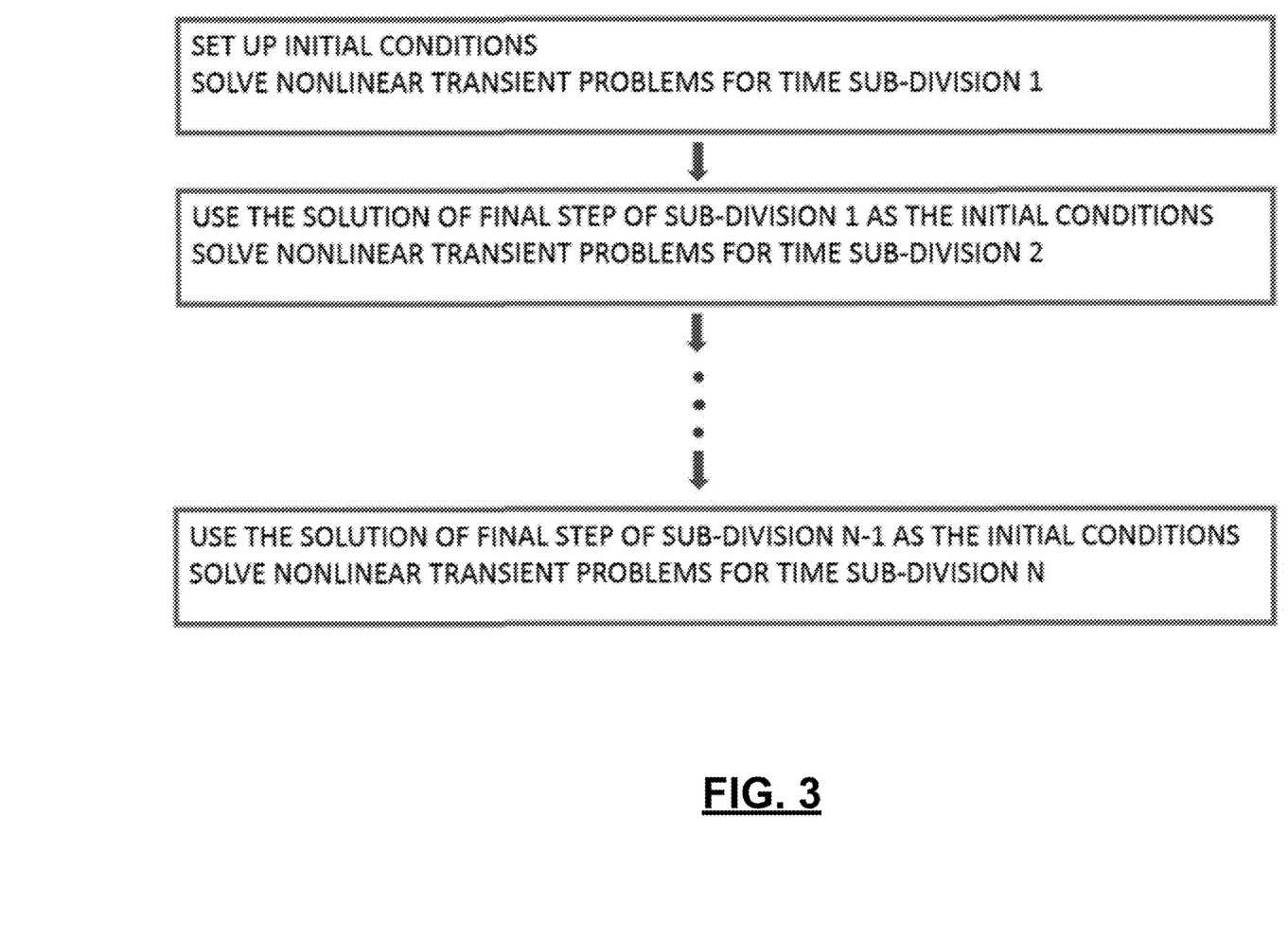
FIG. 3 is a diagram depicting a process for use with a general transient TDM model.

FIG. 3 is a diagram depicting a process for use with a general transient TDM model. The general transient model utilizes collection of many time steps together into a single nonlinear system, linearizing them simultaneously, and iteratively solving the coupled system (6) until convergence. This allows a system to speed up many parts of the solution process, as detailed in this disclosure. For this model, an initial condition is utilized in some implementations, and the solution vector x(t) may not need to satisfy the periodic condition. The method divides the entire nonlinear transient simulation into several sub-divisions along the time-axis and for each sub-division, solves all time steps simultaneously. The procedure is presented in FIG. 3. For each subdivision, systems and methods solve a block matrix at every nonlinear iteration $$\tilde{A}\Delta x = b \quad (7)$$

with $$\tilde{A} = \begin{bmatrix} K_1 & 0 & \ldots & 0 & 0 \\ M_1 & K_2 & \ldots & 0 & 0 \\ 0 & M_2 & \ddots & \vdots & \vdots \\ \vdots & \vdots & \ddots & K_{n-1} & 0 \\ 0 & 0 & \ldots & M_{n-1} & K_n \end{bmatrix} \quad (8)$$

Figure 4:
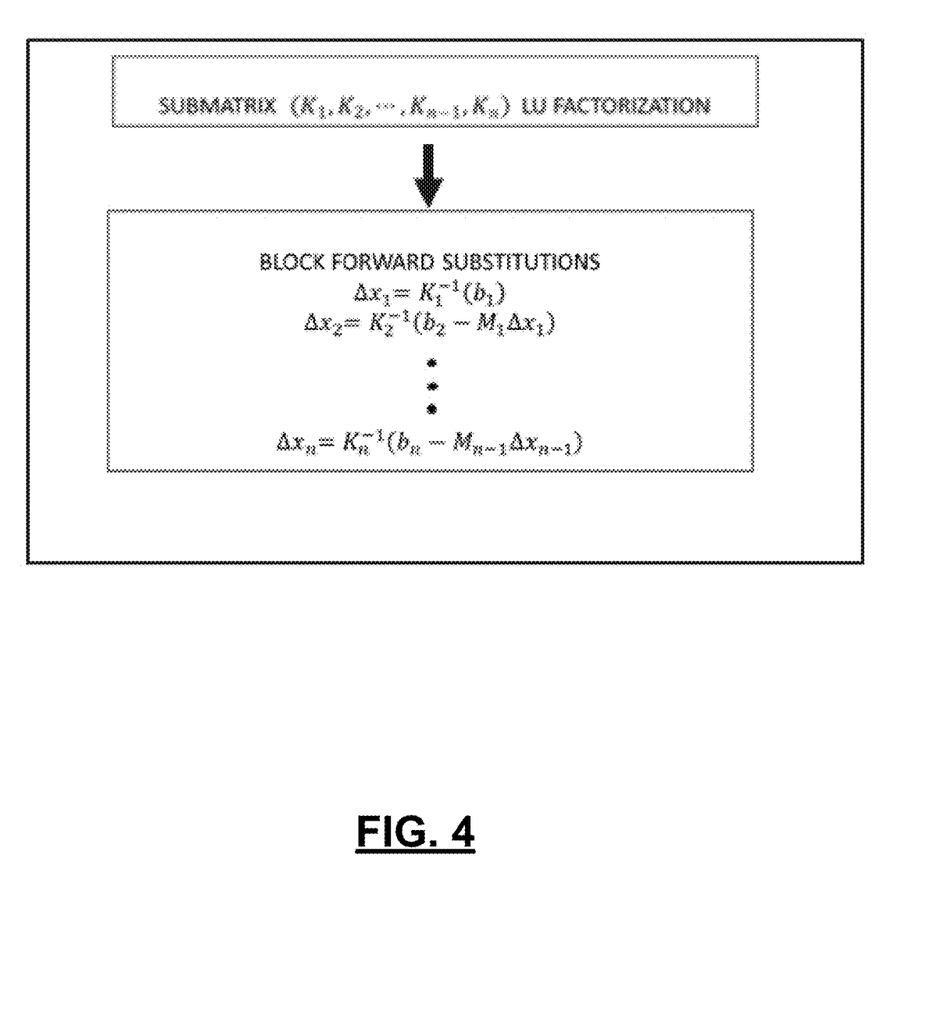
FIG. 4 is a diagram depicting a direct block triangular matrix solver.

Because $\tilde{A}$ is already a lower block triangular matrix, a block direct solver can be utilized. FIG. 4 is a diagram depicting a direct block triangular matrix solver.

Dedicated Solver for Periodic Models

As noted above, different solvers may be utilized depending on the context. In one embodiment, to solve equation (6) using direct solver, an inverse of the matrix A is determined. The computational cost of the inversion of the matrix A can be significantly reduced, in one example, by applying the Woodbury formula.

In one embodiment, the block matrix A is split into two parts:

$$A = \tilde{A} + (U \cdot V^T) \quad (9)$$

One part is the matrix $\tilde{A}$ which is defined by (8), and other part is the product of two block vectors U and $V^T$. Note that $\tilde{A}$ is a lower block triangular matrix, which means that its inversion is much easier than that of A. There are many ways to construct the block vectors U and $V^T$. One way is the following:

$$U = \begin{bmatrix} u_1 \\ 0 \\ \vdots \\ 0 \\ 0 \end{bmatrix}, \quad V^T = [0 \; 0 \; \ldots \; 0 \; v_n] \quad (10)$$

with the sub-block matrix constructed as $$u_1 = \beta \tilde{I}, v_n = \tilde{M}_n / \beta \quad (11)$$

$\beta$ is a free parameter, which can be set to 1, and $\tilde{I}$ is an extended identity matrix with additions row of zeros or column of zeros. For example, $$\tilde{I} = \begin{bmatrix} 0 & 0 & 0 \\ 1 & 0 & 0 \\ 0 & 1 & 0 \\ 0 & 0 & 0 \\ 0 & 0 & 1 \end{bmatrix} \quad (12)$$

Denoting p being the rank and N being the size of the sub-block matrix $M_n$, $\tilde{M}_n$, is a p×N matrix, which is compressed from the matrix $M_n$. For example, $$M_n = \begin{bmatrix} 0 & 0 & 0 & 0 & 0 \\ 1 & 2 & 0 & 0 & 0 \\ 0 & 3 & 4 & 0 & 1 \\ 0 & 0 & 0 & 0 & 0 \\ 0 & 0 & 5 & 6 & 0 \end{bmatrix} \quad (13)$$

can be compressed into $$\tilde{M}_n = \begin{bmatrix} 1 & 2 & 0 & 0 & 0 \\ 0 & 3 & 4 & 0 & 1 \\ 0 & 0 & 5 & 6 & 0 \end{bmatrix} \quad (14)$$

For some practical problems, such as transient behavior of electromechanical devices, the rank p is sometimes very small, namely, p<<N. As a result, the rank of the constructed matrix $u_1$ and $v_n$ is also p. This property of low rank allows equation (6), in some examples, to be efficiently solved by the following procedure.

First solve the following matrix with p right-hand sides $$\tilde{A}Z = U \quad (15)$$

to get the solution vectors $$Z = \begin{bmatrix} z_1 \\ z_2 \\ \vdots \\ z_{n-1} \\ z_n \end{bmatrix} \quad (16)$$

Next, do the p×p matrix inverse to construct matrix H.

$$H = (I + v_n \cdot z_n)^{-1} \quad (17)$$

Then solve the following matrix $$\tilde{A}_y = b \quad (18)$$

to get the solution vector $$y = \begin{bmatrix} y_1 \\ y_2 \\ \vdots \\ y_{n-1} \\ y_n \end{bmatrix} \quad (19)$$

The solution of the (6) can be obtained by the superposition of the solution vectors Z and the solution vector y as $$\Delta_x = y - Z \cdot [H \cdot (v_n y_n)] \quad (20)$$

Figure 5:
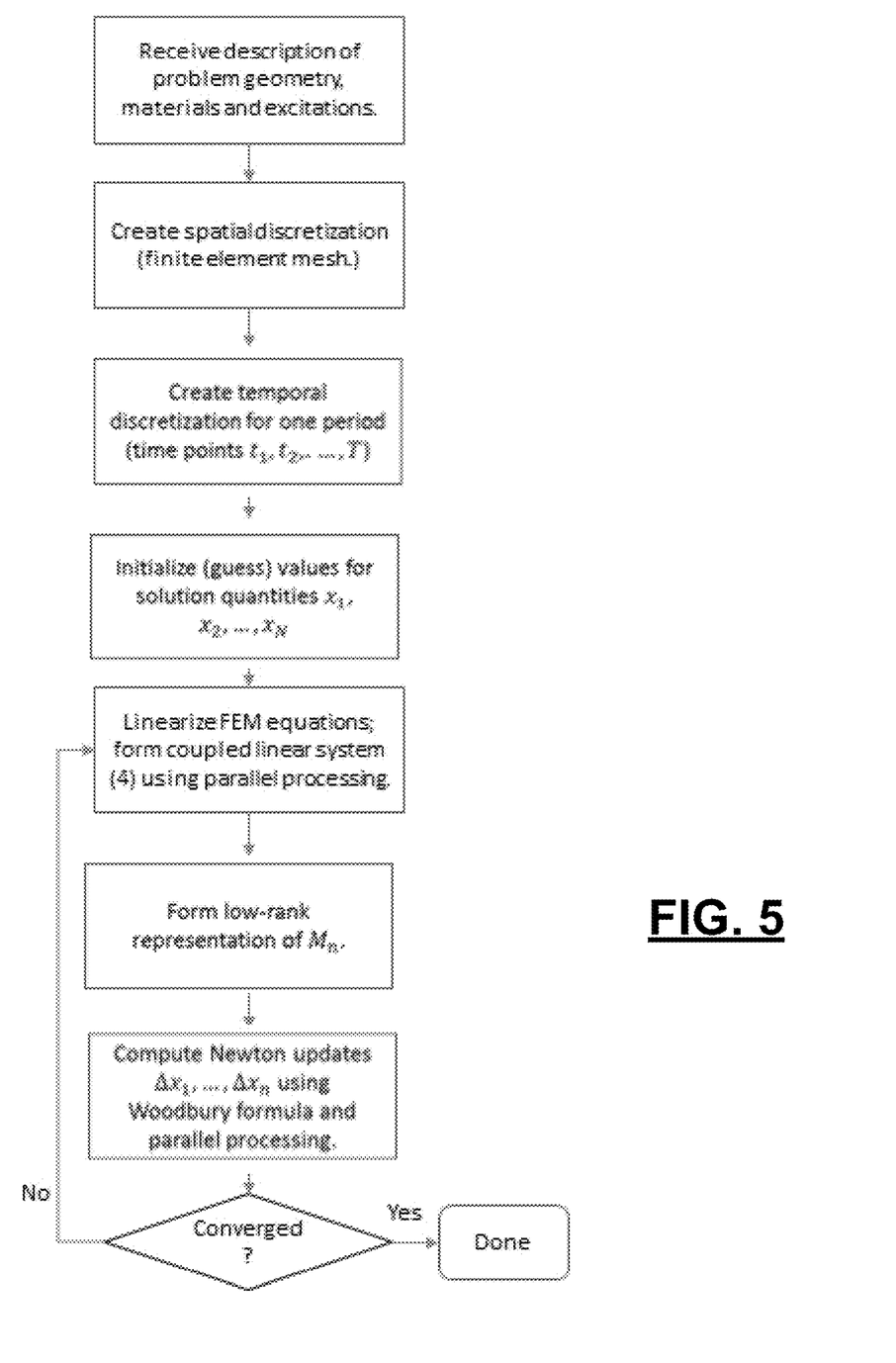
FIG. 5 is a flow diagram depicting a direct solver for a periodic TDM model.

The product of matrix $v_n$ and $z_n$ gives a dense matrix. Usually, the computational cost of a dense matrix inversion is high. But, if the rank p is very small, the computational cost is low. Thus, the direct solver detailed above is very efficient for cases where the rank p is very small. If p is large, an iterative solver can be used. FIG. 5 is a flow diagram depicting a direct solver for a periodic TDM model.

Dedicated Iterative Solver for Periodic Model

An iterative solver with a preconditioner, such as the generalized minimal residual method (GMRES) or the biconjugate gradient method (BiCG) can be used to solve (4). A preconditioner is an approximation to the matrix A such that it can accelerate the convergence of iterations of the iterative solver. There are multiple ways to construct a preconditioner. For example, a preconditioner based on incomplete LU factorizations of submatrixes can be utilized. As another example, three efficient preconditioners, which can be categorized into two types, non-overlapping and overlapping, two of them being non-overlapping and the one of them being overlapping can be used. These preconditioners can be detailed by the following example with n=6, i.e., six time steps.

$$A = \begin{bmatrix} K_1 & & & & & M_6 \\ M_1 & K_2 & & & & \\ & M_2 & K_3 & & & \\ & & M_3 & K_4 & & \\ & & & M_4 & K_5 & \\ & & & & M_5 & K_6 \end{bmatrix} \quad (21)$$

Let C denote the preconditioner. For the case of two subdomains with domain 1 and domain 2, Jacobi preconditioner takes the form $$C_J = \begin{bmatrix} K_1 & 0 & 0 & 0 & 0 & 0 \\ M_1 & K_2 & 0 & 0 & 0 & 0 \\ 0 & M_2 & K_3 & 0 & 0 & 0 \\ 0 & 0 & 0 & K_4 & 0 & 0 \\ 0 & 0 & 0 & M_4 & K_5 & 0 \\ 0 & 0 & 0 & 0 & M_5 & K_6 \end{bmatrix} \quad (22)$$

The two subdomains of the preconditioner are decoupled, so it can be parallelizable. However, the convergence of the iterative solver using Jacobi preconditioner may be slow. Another option is to use Gauss-Seidel preconditioner, which is the lower triangular part of the matrix A, takes the form $$C_{GS} = \begin{bmatrix} K_1 & 0 & 0 & 0 & 0 & 0 \\ M_1 & K_2 & 0 & 0 & 0 & 0 \\ 0 & M_2 & K_3 & 0 & 0 & 0 \\ 0 & 0 & M_3 & K_4 & 0 & 0 \\ 0 & 0 & 0 & M_4 & K_5 & 0 \\ 0 & 0 & 0 & 0 & M_5 & K_6 \end{bmatrix} \quad (23)$$

Figure 6:
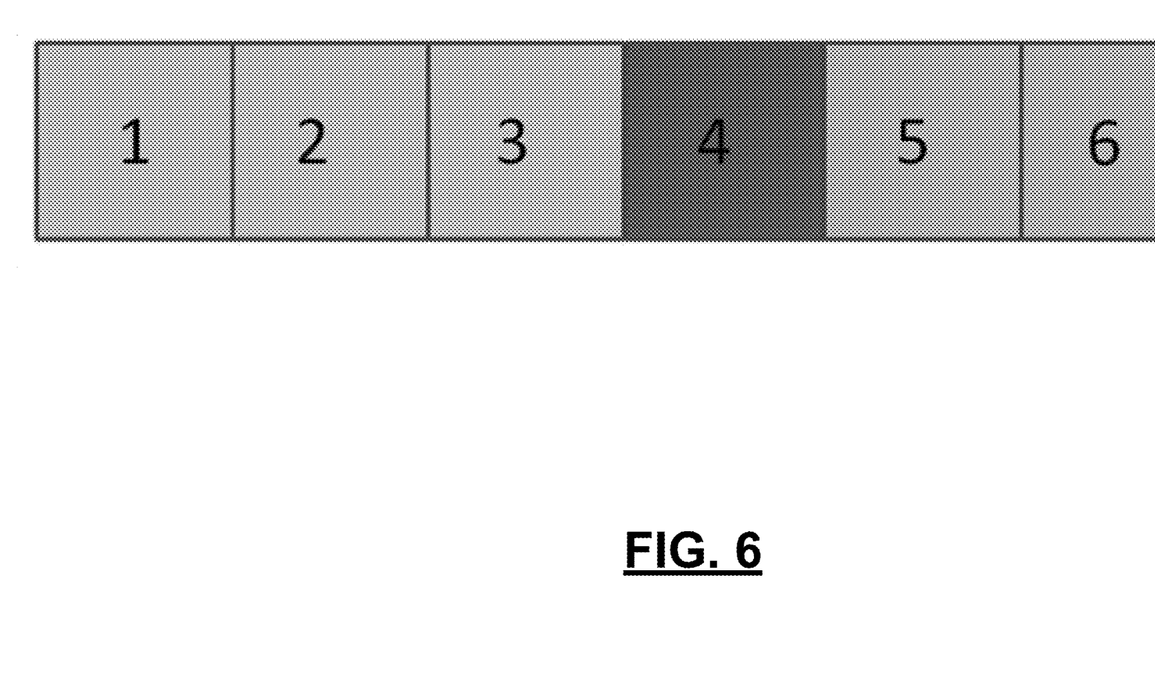
FIG. 6 is a diagram depicting the overlap of two subdomains.
Figure 7:
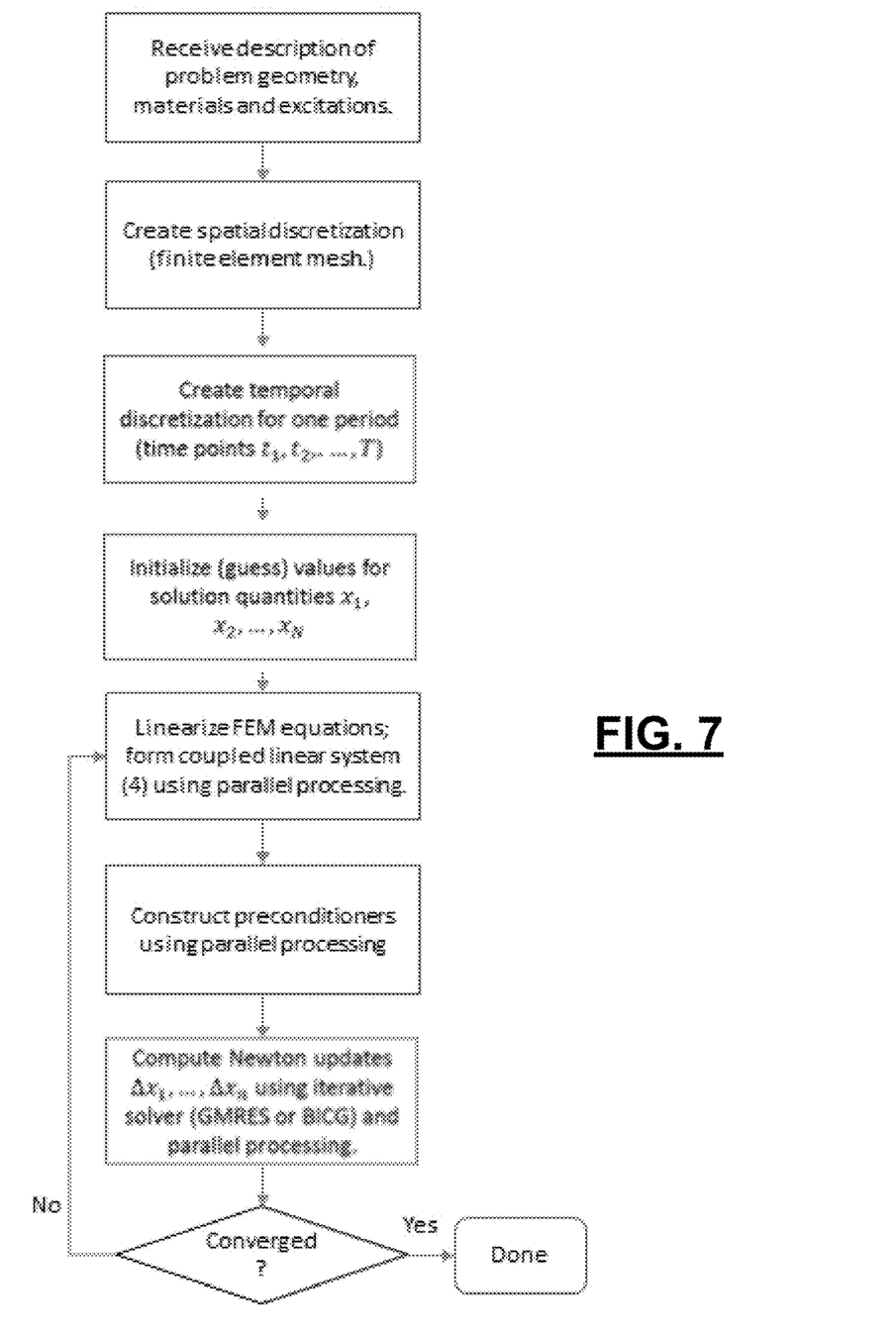
FIG. 7 is a diagram depicting an example iterative solver for a periodic TDM model.

Gauss-Seidel preconditioner can significantly improve the convergence of the iterative solver, but with the cost of less parallelization. With the trade-off between parallelism and convergence the additive Schwarz methods may be a better choice in some instances. The additive Schwarz methods can be conceived as generalization of Jacobi preconditioner. Unlike the Jacobi preconditioner, the subdomains may be overlapped. For example, the domain is composed two subdomains as illustrated in FIG. 6, i.e., domain 1 ($K_1$, $M_1$, $K_2$, $M_2$, $K_3$, $M_3$, $K_4$, $M_4$) and domain 2 ($K_4$, $M_4$, $K_5$, $M_5$, $K_6$, $M_6$). The overlapped region is time step 4 ($K_4$, $M_4$). FIG. 6 is a diagram depicting the overlap of two subdomains. FIG. 7 is a diagram depicting an example iterative solver for a periodic TDM model.

Figure 8:
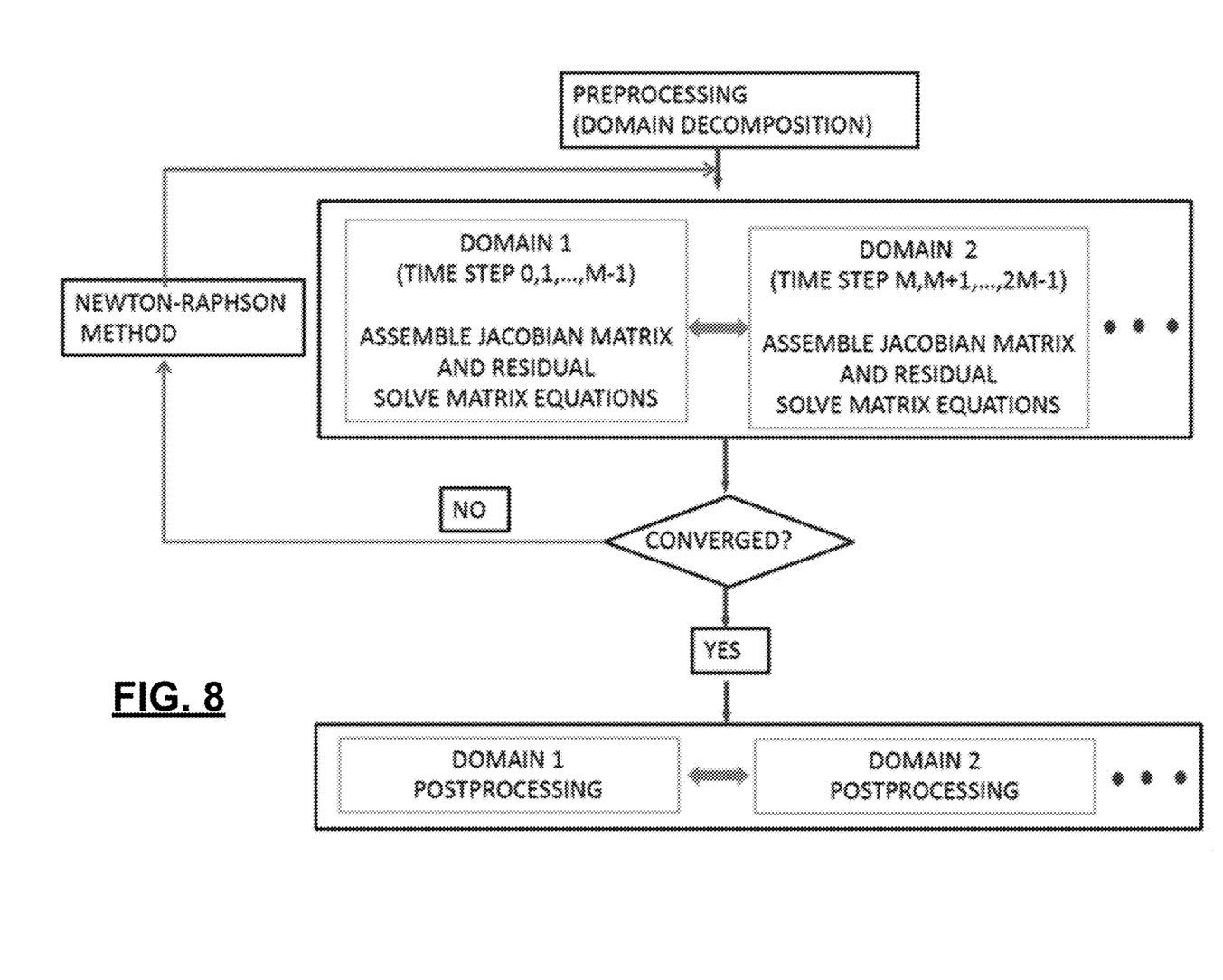
FIG. 8 is a diagram depicting a time domain decomposition method for the transient simulation of nonlinear physical system.

FIG. 8 is a diagram depicting a time domain decomposition method for the transient simulation of nonlinear physical system. The Newton-Raphson technique, due to its quadratic convergence characteristics, can be used for TDM models. However, in some applications, such as the numerical simulation of electromechanical devices, the nonlinear iterations may converge at a very slow rate, or oscillate, or even diverge, especially with the challenge that convergence has to be managed in a much bigger scope, that is, all time steps together, rather than examined by individual time step. To this end, certain techniques can be introduced to overcome the difficulty.

For example, non-TDM transient, the solutions at previous time step can be used to estimate the initial nonlinear operating point for the first nonlinear iteration at each time step to speed up the convergence. But in TDM case, this scheme may not be applicable. In such a case, a better choice in some instances is to start from linear portion of a nonlinear BH curve to have a monotonic convergence. At the same time, due to the significant difference in source excitation, position, etc. among different time steps, systems and methods may utilize a scheme to compute the individual nonlinear residual for each time step by proper scaling based on the normalized quantity in the right hand of the equations associated with individual time step.

In addition, because a relaxation factor which minimizes the square of the 2-norm of the residual with each iteration can be used to improve non-linear convergence, systems and methods use a combination of local relaxation factor associated with an individual time step and the global relaxation factor associated with all time steps. At the beginning, the global relaxation factor can be employed, but after the certain iterations, the local relaxation factor may be further used. The local relaxation factor is determined based on the global relaxation factor and the convergence behavior indicated by the updated nonlinear residual at individual time step. Thus, if the solution for a certain time step has reached a prescribed convergence criterion, a smaller relaxation can be used to avoid undesirable disturbance to the convergence of whole system.

Two Levels of Parallelization

Figure 9:
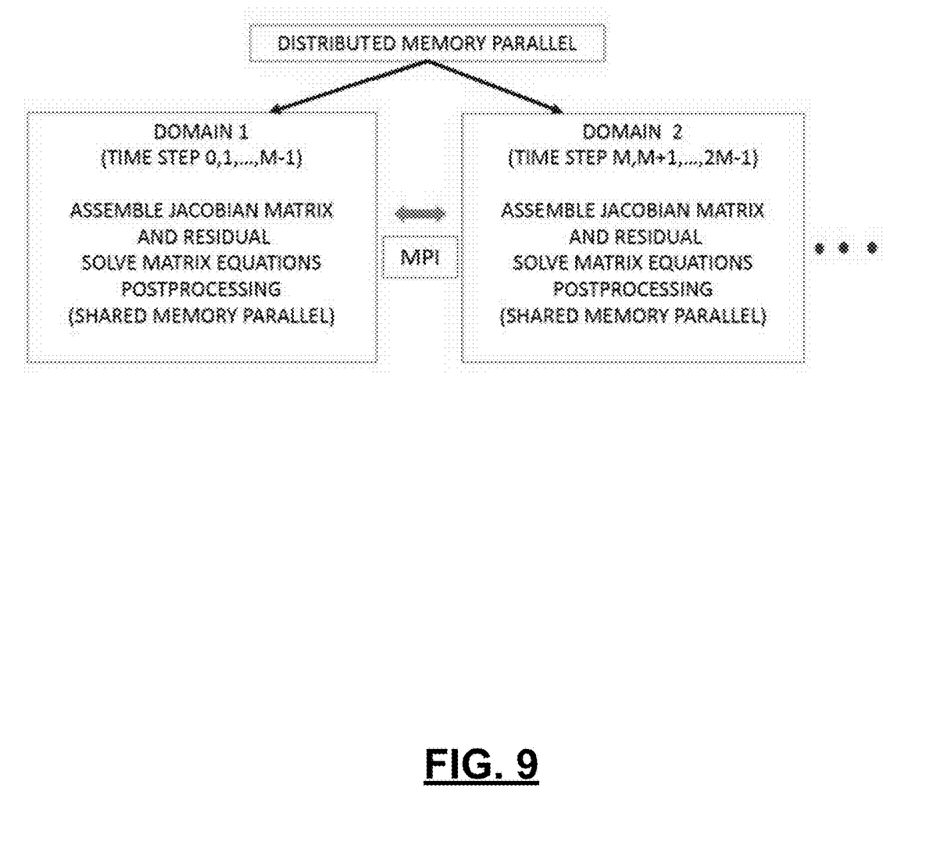
FIG. 9 is a diagram depicting an architecture of implementation of TDM is composed of two levels of parallelization with the distributed memory parallelization based on MPI (Message Passing Interface) at the higher level and shared memory parallelization based on multi-threading at the lower level.

Certain systems and methods for a domain decomposition method generally consist of one or more of three parts: preprocessing, analysis, and post processing. The preprocessing part includes the model setup with excitations and boundaries, meshing, decomposing domains, etc. The analysis part includes matrix assembling and solving the block matrix. The post processing part includes computing some physical quantities based on the matrix solution vectors. FIG. 9 is a diagram depicting an architecture of implementation of TDM is composed of two levels of parallelization with the distributed memory parallelization based on MPI (Message Passing Interface) at the higher level and shared memory parallelization based on multi-threading at the lower level. For each MPI process, corresponding to each domain, the shared memory parallelization can be further applied for submatrix assembling, factorizations and post processing.

In parallel computations, it can be beneficial to maintain data localizations to minimize the cost of the data transferring between processes. This is because in parallel computer hardware architectures the time for data transferring is much longer than that of arithmetic computation. Therefore, it can be seen from FIG. 9 that in addition to the communication between the master node and slave nodes as other domain decomposition methods do, there are also the communications between neighboring slave nodes in the developed time domain decomposition method, which will significantly alleviate the communication burden on the master node. As a result, a natural mechanism to preserving data localizations is fulfilled. The following table illustrates the data localizations based on two domains.

| Process (Domain) | Data |
| --- | --- |
| Process 1 (Domain 1) | $K_1, M_1, \Delta x_1, b_1, K_2, M_2, \Delta x_2, b_2, K_3, M_3, \Delta x_3, b_3$ |
| Process 2 (Domain 2) | $K_4, M_4, \Delta x_4, b_4, K_5, M_5, \Delta x_5, b_5, K_6, M_6, \Delta x_6, b_6$ |

Figure 10A:
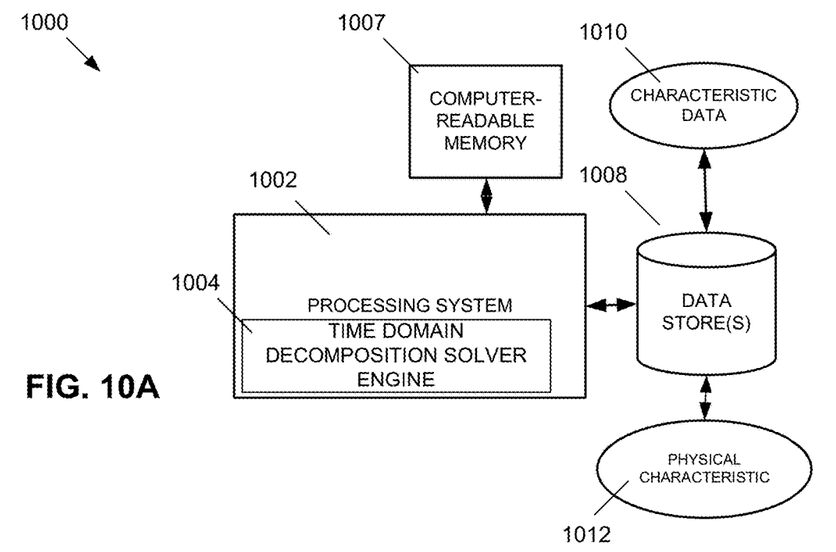
FIGS. 10A, 10B, and 10C depict example systems for implementing the approaches described herein for implementing a computer-implemented time domain decomposition solver engine.
Figure 10B:
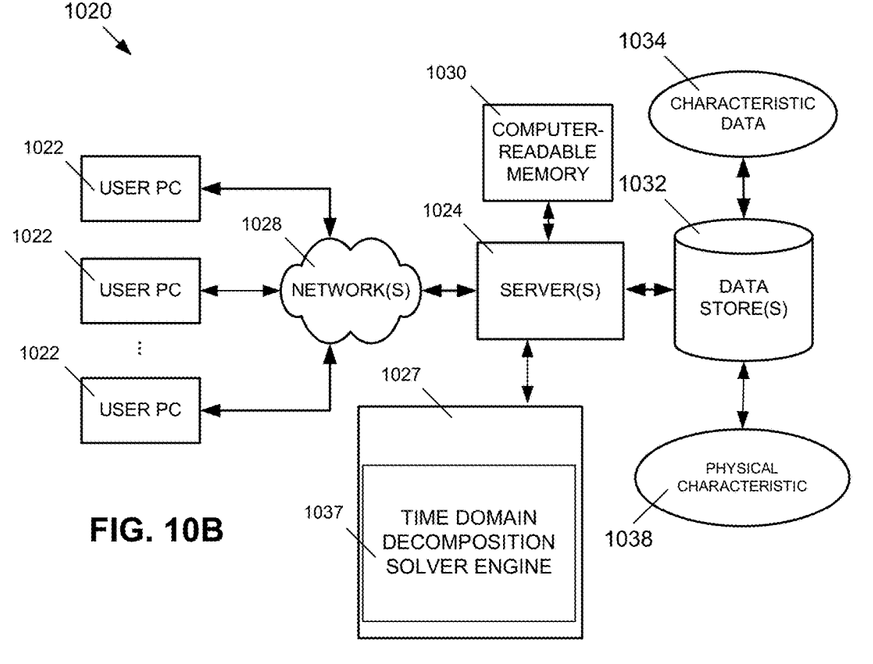
Figure 10C:
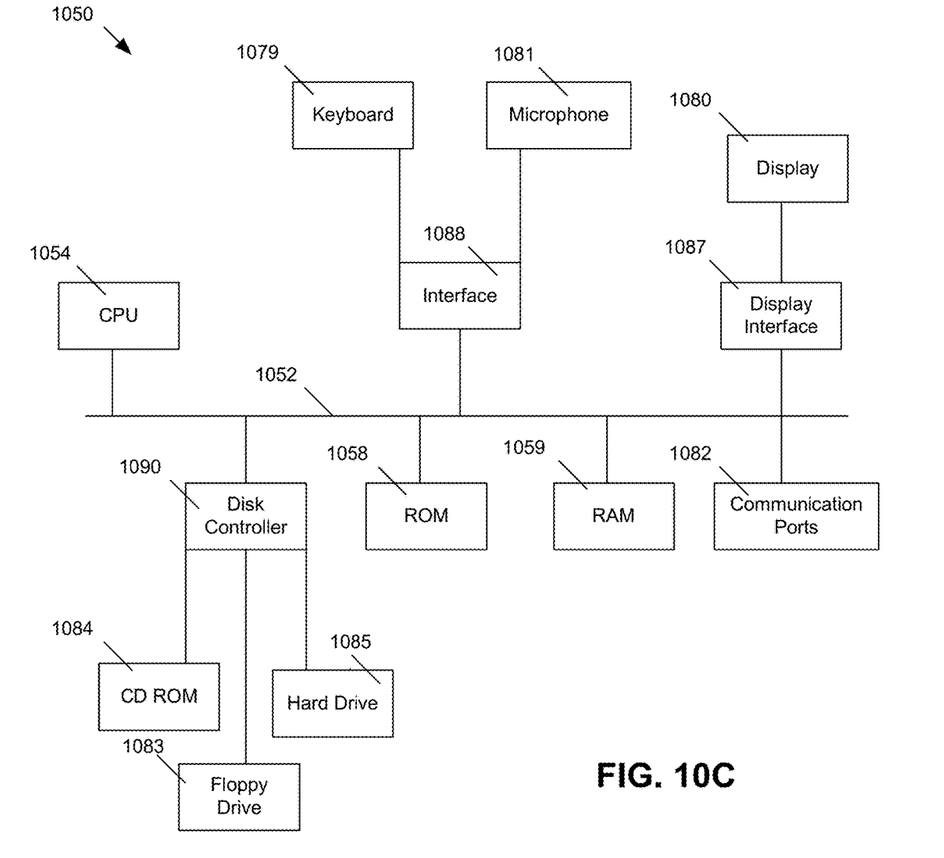

FIGS. 10A, 10B, and 10C depict example systems for implementing the approaches described herein for implementing a computer-implemented time domain decomposition solver engine. For example, FIG. 10A depicts an exemplary system 1000 that includes a standalone computer architecture where a processing system 1002 (e.g., one or more computer processors located in a given computer or in multiple computers that may be separate and distinct from one another) includes a computer-implemented cohesiveness evaluation engine 1004 being executed on the processing system 1002. The processing system 1002 has access to a computer-readable memory 1007 in addition to one or more data stores 1008. The one or more data stores 1008 may include characteristic data 1010 as well as physical characteristics 1012. The processing system 1002 may be a distributed parallel computing environment, which may be used to handle very large-scale data sets.

FIG. 10B depicts a system 1020 that includes a client-server architecture. One or more user PCs 1022 access one or more servers 1024 running a computer-implemented time domain decomposition solver engine 1037 on a processing system 1027 via one or more networks 1028. The one or more servers 1024 may access a computer-readable memory 1030 as well as one or more data stores 1032. The one or more data stores 1032 may include characteristic data 1034 as well as physical characteristics 1038.

FIG. 10C shows a block diagram of exemplary hardware for a standalone computer architecture 1050, such as the architecture depicted in FIG. 10A that may be used to include and/or implement the program instructions of system embodiments of the present disclosure. A bus 1052 may serve as the information highway interconnecting the other illustrated components of the hardware. A processing system 1054 labeled CPU (central processing unit) (e.g., one or more computer processors at a given computer or at multiple computers), may perform calculations and logic operations required to execute a program. A non-transitory processor-readable storage medium, such as read only memory (ROM) 1058 and random access memory (RAM) 1059, may be in communication with the processing system 1054 and may include one or more programming instructions for performing the method of implementing a computer-implemented time domain decomposition solver engine. Optionally, program instructions may be stored on a non-transitory computer-readable storage medium such as a magnetic disk, optical disk, recordable memory device, flash memory, or other physical storage medium.

In FIGS. 10A, 10B, and 10C, computer readable memories 1008, 1030, 1058, 1059 or data stores 1008, 1032, 1083, 1084, 1088 may include one or more data structures for storing and associating various data used in the example systems for implementing a computer-implemented time domain decomposition solver engine. For example, a data structure stored in any of the aforementioned locations may be used to store data from XML files, initial parameters, and/or data for other variables described herein. A disk controller 1090 interfaces one or more optional disk drives to the system bus 1052. These disk drives may be external or internal floppy disk drives such as 1083, external or internal CD-ROM, CD-R, CD-RW or DVD drives such as 1084, or external or internal hard drives 1085. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 1090, the ROM 1058 and/or the RAM 1059. The processor 1054 may access one or more components as required.

A display interface 1087 may permit information from the bus 1052 to be displayed on a display 1080 in audio, graphic, or alphanumeric format. Communication with external devices may optionally occur using various communication ports 1082.

In addition to these computer-type components, the hardware may also include data input devices, such as a keyboard 1079, or other input device 1081, such as a microphone, remote control, pointer, mouse and/or joystick.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, JAVA™, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

It is claimed:

1. A processor-implemented method of constructing a physical system, comprising:
   receiving characteristic data associated with a physical system;
   building a model of the physical system based on the characteristic data;
   performing a nonlinear transient simulation of the physical system using the model, wherein the simulation is performed over a plurality of time intervals, wherein performing the simulation comprises:
      a master node segmenting the plurality of time intervals into groups of time intervals, each group containing multiple time intervals;
      transmitting data associated with each group of time intervals to at least two different slave nodes; and
      solving each of the groups of time intervals in parallel using the different slave nodes;
   determining a physical characteristic based on results of the simulation;
   wherein the physical system is built or modified based on the simulation-determined physical characteristic; and
   wherein the model is built according to:

$$A\Delta x = \begin{bmatrix} K_1 & 0 & \cdots & 0 & M_n \\ M_1 & K_2 & \cdots & 0 & 0 \\ 0 & M_2 & \ddots & \vdots & \vdots \\ \vdots & \vdots & \ddots & K_{n-1} & 0 \\ 0 & 0 & \cdots & M_{n-1} & K_n \end{bmatrix} \begin{bmatrix} \Delta x_1 \\ \Delta x_2 \\ \vdots \\ \Delta x_{n-1} \\ \Delta x_n \end{bmatrix} = \begin{bmatrix} b_1 \\ b_2 \\ \vdots \\ b_{n-1} \\ b_n \end{bmatrix},$$

wherein $K_i$ and $M_i$ are Jacobian matrices in which $K_i = \Delta t S'_i + T'_i$ and $M_i = -T'_i$, $\Delta x_i$ is an increment of nonlinear iterations, and $b_i$ is a residual of nonlinear iterations.

2. The method of claim 1, further comprising:
   determining whether the physical system is a periodic system or a non-periodic system, wherein a first model is built when the physical system is a periodic system, and a second model is built when the physical system is a non-periodic system.

3. The method of claim 2, wherein said determining is automatically performed by a computer system.

4. The method of claim 1, wherein when the physical system is a periodic system.

5. The method of claim 4, further comprising:
   comparing a rank of the $M_n$ matrix to a threshold;
   wherein when the rank of the $M_n$ matrix is less than the threshold, using a direct solver to solve the time intervals of the model;
   wherein when the rank of the $M_n$ matrix is equal to or greater than the threshold, using an iterative solver to solve the time intervals of the model.

6. The method of claim 5, wherein the iterative solver comprises a loop that processes the time intervals of the model until a convergence criterion is met.

7. The method of claim 6, further comprising:
   adjusting the A matrix using a preconditioner prior to grouping the time intervals of the model for parallel solving.

8. The method of claim 5, wherein when the rank of the $M_n$ block of an original system matrix is less than the threshold, the $M_n$ block is set to zero, a remaining lower-block-triangular matrix is LU-factored in parallel by a direct solver, and a solution to the original matrix is obtained via a Woodbury formula.

9. The method of claim 1, wherein when the physical system is a non-periodic system.

10. The method of claim 9, wherein a block direct solver is used to solve the time intervals of the non-periodic system model.

11. The method of claim 10, wherein the block direct solver performs LU factorizations on each of a plurality of blocks of the A matrix followed by a plurality of block forward substitution operations.

12. The method of claim 1, wherein, once the groups of time intervals are solved in parallel, a convergence check is performed;
   when convergence is not achieved, Jacobian matrices associated with each group are updated and re-solved in parallel;
   when convergence is achieved, post processing is performed to determine the physical characteristic.

13. The method of claim 12, wherein the groups are adjusted using a Newton-Raphson method.

14. The method of claim 1, wherein a first portion of data associated with the model is transmitted to a first slave node based on which specific group of time intervals is assigned to the first node, and wherein a second, different portion of data associated with the model is transmitted to a second slave node based on which specific group of time intervals is assigned to the second slave node.

15. The method of claim 1, wherein each slave node is a separate central processing unit.

16. The method of claim 1, wherein the simulation analyzes a physical reaction of the physical system to an input.

17. The method of claim 16, wherein the physical reaction is a wave propagation in a medium, heat conduction, or a transient behavior of an electromechanical device.

18. A computer-implemented system for constructing a physical system, comprising:
one or more data processors;
a non-transitory computer-readable medium encoded with instructions for commanding one or more data processors to execute steps including:
receiving characteristic data associated with a physical system;
building a model of the physical system based on the characteristic data;
performing a nonlinear transient simulation of the physical system using the model, wherein the simulation is performed over a plurality of time intervals, wherein performing the simulation comprises:
a master node segmenting the plurality of time intervals into groups of time intervals, each group containing multiple time intervals;
transmitting data associated with each group of time intervals to at least two different slave nodes; and
solving each of the groups of time intervals in parallel using the different slave nodes;
determining a physical characteristic based on results of the simulation;
wherein the physical system is built or modified based on the simulation-determined physical characteristic; and
wherein the model is built according to:

$$A\Delta x = \begin{bmatrix} K_1 & 0 & \cdots & 0 & 0 \\ M_1 & K_2 & \cdots & 0 & 0 \\ 0 & M_2 & \ddots & \vdots & \vdots \\ \vdots & \vdots & \ddots & K_{n-1} & 0 \\ 0 & 0 & \cdots & M_{n-1} & K_n \end{bmatrix} \begin{bmatrix} \Delta x_1 \\ \Delta x_2 \\ \vdots \\ \Delta x_{n-1} \\ \Delta x_n \end{bmatrix} = \begin{bmatrix} b_1 \\ b_2 \\ \vdots \\ b_{n-1} \\ b_n \end{bmatrix},$$

wherein $K_i$ and $M_i$ are Jacobian matrices in which $K_i = \Delta t S'_i + T'_i$ and $M_i = -T'_i$, $\Delta x_i$ is an increment of nonlinear iterations, and $b_i$ is a residual of nonlinear iterations.

19. The system of claim 18, wherein the steps further comprise:
determining whether the physical system is a periodic system or a non-periodic system, wherein a first model is built when the physical system is a periodic system, and a second model is built when the physical system is a non-periodic system.

20. The system of claim 18, wherein when the physical system is a periodic system.

21. The system of claim 20, wherein the steps further comprise:
comparing a rank of the M matrix to a threshold; wherein when the rank of the M matrix is less than the threshold, using a direct solver to solve the time intervals of the model;
wherein when the rank of the M matrix is equal to or greater than the threshold, using an iterative solver to solve the time intervals of the model.

22. A non-transitory computer-readable medium encoded with instructions for commanding one or more data processors to execute steps of a method for constructing a physical system, the method comprising:
receiving characteristic data associated with a physical system;
building a model of the physical system based on the characteristic data;
performing a nonlinear transient simulation of the physical system using the model, wherein the simulation is performed over a plurality of time intervals, wherein performing the simulation comprises:
a master node segmenting the plurality of time intervals into groups of time intervals, each group containing multiple time intervals;
transmitting data associated with each group of time intervals to at least two different slave nodes; and
solving each of the groups of time intervals in parallel using the different slave nodes;
determining a physical characteristic based on results of the simulation;
wherein the physical system is built or modified based on the simulation-determined physical characteristic; and
wherein the model is built according to:

$$A\Delta x = \begin{bmatrix} K_1 & 0 & \cdots & 0 & M_n \\ M_1 & K_2 & \cdots & 0 & 0 \\ 0 & M_2 & \ddots & \vdots & \vdots \\ \vdots & \vdots & \ddots & K_{n-1} & 0 \\ 0 & 0 & \cdots & M_{n-1} & K_n \end{bmatrix} \begin{bmatrix} \Delta x_1 \\ \Delta x_2 \\ \vdots \\ \Delta x_{n-1} \\ \Delta x_n \end{bmatrix} = \begin{bmatrix} b_1 \\ b_2 \\ \vdots \\ b_{n-1} \\ b_n \end{bmatrix},$$

wherein $K_i$ and $M_i$ are Jacobian matrices in which $K_i = \Delta t S'_i + T'_i$ and $M_i = -T'_i$, $\Delta x_i$ is an increment of nonlinear iterations, and $b_i$ is a residual of nonlinear iterations.

* * * * *